United States Patent [19]
Grassmann

[11] Patent Number: 6,025,116
[45] Date of Patent: *Feb. 15, 2000

[54] ETCHING OF CONTACT HOLES

[75] Inventor: Andreas Grassmann, Bad Abbach, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/829,575

[22] Filed: Mar. 31, 1997

[51] Int. Cl.$^7$ .................................................. G03F 7/26
[52] U.S. Cl. ........................ 430/313; 430/317; 216/18
[58] Field of Search ..................... 430/313, 312, 430/314, 316, 317; 216/16, 17, 18

[56] References Cited

U.S. PATENT DOCUMENTS

| | | |
|---|---|---|
| 4,315,984 | 2/1982 | Okazaki et al. ........................ 430/296 |
| 4,758,530 | 7/1988 | Schubert ................................... 437/69 |
| 5,173,442 | 12/1992 | Carey ....................................... 430/312 |
| 5,246,817 | 9/1993 | Shipley, Jr. ............................. 430/312 |
| 5,260,152 | 11/1993 | Shimizu et al. ............................ 430/5 |
| 5,320,932 | 6/1994 | Haraguchi et al. ..................... 430/312 |
| 5,358,827 | 10/1994 | Garofalo et al. ........................ 430/313 |
| 5,465,859 | 11/1995 | Chapple-Sokol et al. ................ 216/12 |
| 5,484,672 | 1/1996 | Bajuk et al. ............................. 430/546 |
| 5,635,423 | 6/1997 | Huang et al. ............................ 438/638 |
| 5,679,608 | 10/1997 | Cheung et al. .......................... 438/622 |
| 5,686,354 | 11/1997 | Avanzino et al. ........................ 216/18 |
| 5,741,626 | 4/1998 | Jain et al. ................................ 430/312 |

*Primary Examiner*—Kathleen Duda
*Attorney, Agent, or Firm*—Stanton C. Braden

[57] ABSTRACT

The photolithographic etching of contact holes in trenches in an insulator layer over a silicon body is improved by adjusting properly the depth of the trench and the thickness of the photoresist used in the photolithography.

15 Claims, 1 Drawing Sheet

ETCHING OF CONTACT HOLES

FIELD OF THE INVENTION

This invention relates to lithography for transferring images onto a substrate surface for fabricating devices and, more particularly, to forming structures wherein the resist layer has an uneven thickness.

BACKGROUND OF THE INVENTION

In semiconductor fabrication, insulating, semiconducting, and conducting layers are formed on a substrate. The formation of the various layers is achieved using conventional fabrication techniques, such as oxidation, implantation, deposition, and epitaxial growth of silicon. Such techniques are described in S. M. Sze, *VLSI Technology*, 2nd ed., New York, McGraw-Hill, 1988, which is herein incorporated by reference for all purposes. Individual layers are patterned to create features and spaces, forming devices, such as transistors, capacitors, and resistors. These devices are then interconnected to achieve a desired electrical function, thereby producing an integrated circuit (IC). The patterning of the various device layers is achieved through lithography.

Lithography is the process for transferring images onto the substrate to define features. In general, a mask layer comprising, for example, photoresist is first formed on the surface of the substrate. The mask layer is then selectively exposed. Selective exposure of the mask layer is achieved using a mask and exposure source. Depending on whether a positive or negative resist is used, the exposed or unexposed regions are removed by etching to form the features.

A never ceasing demand for greater device integration has led to more densely packed ICs with smaller feature size. However, such advancements in technology have made it increasingly more difficult to form device structures consistently and reliably. For example, as dimensions decrease, alignment of structures in the various device layers requires greater precision. Additionally, proper exposure of the resist becomes problematic when imaging features of minimum dimensions, (i.e., the size of the feature is equal to about the wavelength of the exposure source). Underexposure and/or overexposure of the resist results in a defective or unreliable feature. Thus, a smaller process window exists for lithographic imaging of such structures. This causes process control problems, decreasing manufacturing reliability and yield.

To illustrate the difficulties resulting from a decrease in feature size, a discussion of interlevel connections is provided. Typically, interlevel connections are achieved using, for example, a dual-damascene process. In such a process, two sequential photoresist and etch steps are used to form the interlevel connections. For example, a first step is used to form a first contact opening or via to an underlying layer. A second in-line opening is then made to form a conductive line above the via. Both openings are then filled with aluminum.

The desire to form vias and trenches at about minimum dimensions causes problems that adversely affect the reliability of contacts formed. For example, light from the exposure source has a wavelength that is equal to about the mask openings or reticles that define the contact holes. Such a configuration makes it difficult for the lightwaves to pass through the reticles, resulting in an improper or underexposure of the photoresist. The underexposed photoresist prevents the contact holes from being completely opened by the etching process. As a result, the contact holes are not adequately filled with aluminum, degrading the reliability of the contacts formed.

The problem is aggravated by the difficulty in detecting such residual resist until after the contact fill has been added and the contact tested. The difficulty arises because the critical dimensions both at the top of the trench and at the top of the contact hole may be measured and found to be within the design specifications, even though there is a residue of photoresist in the contact hole of an amount sufficient to result eventually in a faulty contact.

One solution to the underexposure problem is to increase the intensity of the light used to expose the photoresist. This can overexpose the resist at some of the regions in which contact holes are to be formed. Overexposure enlarges the regions that is subsequently etched results in the formation of excessively large contact holes, which can result in shorts.

From the above discussion, it is desirable to form reliable structures, such as contacts, in the fabrication of ICs.

SUMMARY OF THE INVENTION

The invention provides for improved exposure of photoresist in lithography for forming semiconductor devices. Improving photoresist exposure results in the formation of more reliable structures, such as contact holes used for interlevel connections.

The invention is based on two main principles to get the proper amount of light in the trench where the contact hole is to be formed. First, it is important to adjust the thickness of the photoresist used to print the contact hole pattern to reduce its sensitivity to light from the exposure source that is outside the trenches. The less sensitive that the photoresist in the contact hole is to light outside the trenches, the better the exposure of the photoresist in the contact hole. Second adjusting the sensitivity of the photoresist in the contact hole is accomplished by varying the thickness of the photoresist outside of the trench as well as adjusting the depth of the trench to vary the thickness of the photoresist therein. In accordance with the invention, a dose-to-clear swing curve associated with the photoresist is used to determine the thickness of the photoresist inside and outside the trench area. In one embodiment, the thickness of the photoresist inside and outside the trench area is chosen such that the photoresist outside the trench area is less sensitive to the exposure source and the photoresist in the trench is more sensitive to the exposure source.

The invention will be better understood from the following more detailed description taken in conjunction with the accompanying drawing.

DETAILED DESCRIPTION

The invention relates to lithography which is used to print and form structures in or on a substrate to create devices. For purposes of discussion, the invention is described in the context of forming interlevel connections in integrated circuits such as, for example, memory devices including DRAMs, SRAMs, and SDRAMs. However, the invention has broader applications. Merely by way of example, the invention is applicable to forming structures reliably in or on the substrate surface. Particularly, the invention resolves the problems resulting from uneven thickness in the resist material used for lithographic masking.

Figure 1:
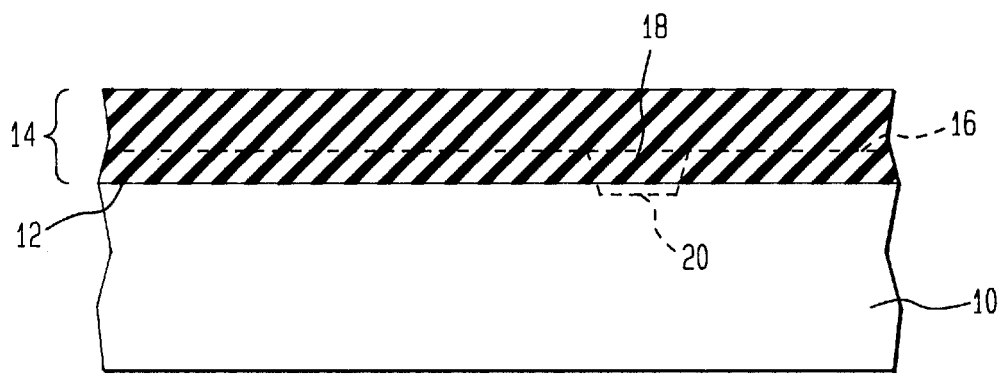
FIG. 1 shows a cross-sectional view of a semiconductor body over whose top surface there is a dielectric cap that includes a trench in which a contact hole provides a via by means of which a conductive fill in the trench is to make electrical contact with a particular region of the body.

Referring now to FIG. 1, there is shown a semiconductor body (typically of silicon) 10 in which an integrated circuit is to be formed. Body 10 includes over a top surface 12 thereof an insulator layer (dielectric cap) 14, which is typically a dielectric, such as a silicate glass or a multilayer insulator, that can passivate the surface of the silicon body 10. Body 10 with layer 14 thereon may be denoted as a substrate.

The dielectric cap 14 is provided with a trench 16 (denoted by a dashed line) that eventually will be filled with a conductor to serve as a conductive line that runs over the top surface 12 of the silicon body 10 and is electrically isolated from it by the remaining thickness of the dielectric cap 14. The trench 16 also includes a contact hole 18 (denoted by a dashed line) that will be similarly filled with a conductive material that is an extension of that in the trench 16. Conductive materials used to fill the contact hole include, for example, aluminum (Al) alloys, tungsten (W), copper (Cu), titanium (Ti), metal derivatives such as titanium silicide and titanium nitride, or other conductive materials used to form interconnections. The contact hole 18 forms a via through the remaining thickness of the dielectric layer 14 so that conductive fill in hole 18 can make low resistance contact to a localized region 20 at the top surface 12 of the body 10. Such region 20 may correspond, for example, to a source, drain or gate of a transistor or to a node in the integrated circuit incorporated in the body 10.

The conductive line formed by the conductive fill in trench 16 typically will be part of a complex network of conductive lines that form the interconnection of the network of the integrated circuit. In complex integrated circuits there may be a plurality of interconnection metallizations formed on different levels above the surface 12 of the body 10.

Typically, the trench 16 is formed by means of a photolithographic process in which a layer of photoresist is deposited over the dielectric cap 14 which covers surface 12 of body 10. A pattern of light corresponding to the pattern desired for the trench is focused on the photoresist to expose it appropriately. After such exposure, the unexposed portions of the photoresist are etched away selectively to pattern the photoresist. The patterned photoresist is then used as a mask to etch the trench in the dielectric cap 14 selectively, typically by reactive ion etching (RIE). The RIE removes a portion of the dielectric cap to form the trench. The remaining portion of the dielectric cap serves to isolate the conductive material in the trench from the underlying layer.

The RIE can anisotropically etch the dielectric cap to form in the dielectric a trench that has side walls that may be either essentially vertical or appropriately tapered, according to the etching technique employed. There are possible a number of variations of this technique. For example, in some cases the dielectric cap is first covered with a layer of material that can serve as a mask and the photoresist process described is used to pattern this layer, which after being patterned, is used as the mask to pattern selectively the dielectric layer. Alternatively, the lithography can be reversed so that the unexposed photoresist is etched and the irradiated photoresist remains to form the mask.

After the trench has been formed, contact holes are then formed in regions where contact to the underlying layer is desired. Formation of contact holes requires essentially a repetition of the earlier photolithographic process described for forming the pattern of trenches. However, it can be appreciated that the top surface of the dielectric cap is no longer a smooth planar surface because of the presence of the trenches. As a result, after the photoresist is deposited over the dielectric cap, typically by a spin dry process, and its top surface smoothed, the layer of photoresist will not be of uniform thickness but rather will be thicker by the depth of the trench where it overlies and fills a trench. At a region within the trench 16 where a contact hole is to be formed, the thickness of the photoresist is greater than where there is no trench. Accordingly, it is difficult to adequately expose this thicker portion of photoresist than the thinner portions. Unfortunately, any photoresist that has not been adequately exposed will remain in place during a subsequent step of etching away selectively the exposed photoresist. If it remains in place, it will not be possible to etch out completely the desired via through the dielectric cap and a faulty contact may be the end result.

The present invention seeks to improve this situation. Essentially, it involves adjusting properly relative to one another, both the thickness of the photoresist deposited over the dielectric cap and the thickness of photoresist where it extends into the trench, and so is thicker by the depth of the trench. This latter adjustment involves choosing appropriately the depth of the trench.

It will be desirable before explaining how these thicknesses are chosen to briefly discuss the properties desired of the photoresist on the dielectrically capped body 10.

First, the body and dielectric cap should have low absorption for the light to be used for exposing the photoresist, the lower the absorption by the various layers of the cap and body, the larger the oscillations, or swings, of the swing curve characteristic of the system. A swing curve will be explained below. Additionally, it is important that there be the ability to control photoresist thickness over the body 10 so that it can be set to closely approximate a minimum in the swing curve, one of the two basic criteria characteristic of the invention. This usually requires an ability to control the thickness of other layers on the surface of the body, particularly transparent layers through which the exposing light would pass.

Sometimes these criteria cannot be met fully, either because of excessive absorption by one of the layers that are necessarily used, inability to control the thickness of one of the transparent layers, such as a silicon dioxide layer, or the topography under a transparent film makes it impossible to establish the desired controlled thickness of the transparent film. In such instances, it may prove desirable to deposit an opaque reflecting film, such as a thin layer of polycrystalline silicon, over the top surface of the silicon body to reduce the importance of such uncontrollable effects and to establish a well controlled phase relationship between the bottom and top of the trenches.

Figure 2:
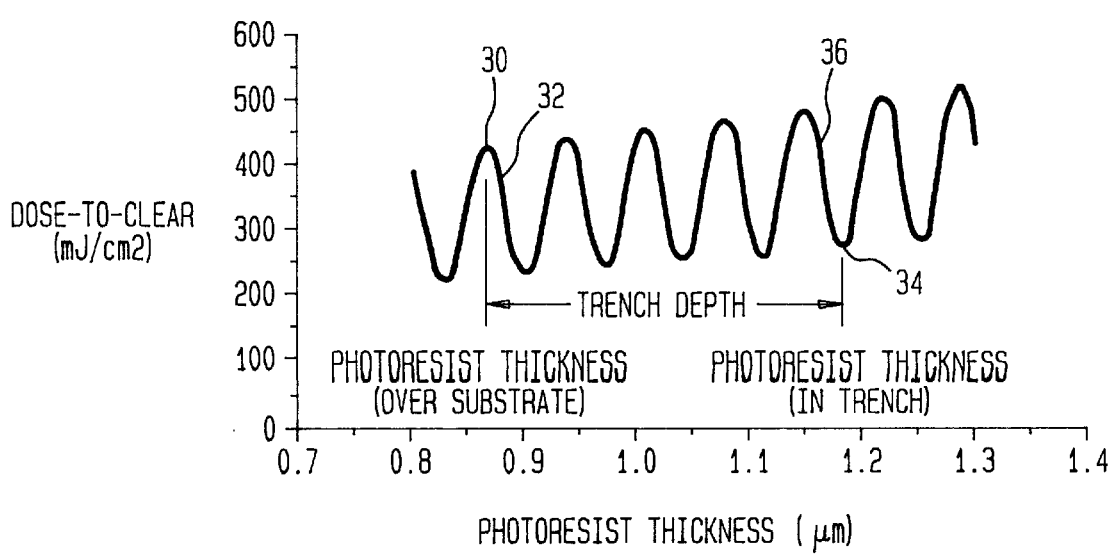
FIG. 2 shows a swing curve typical of the kind that plays an important role in prescribing parameters for the photolithographic patterning of contact holes in accordance with the present invention.

FIG. 2 graphically shows a typical swing curve in which photoresist thickness (um) is the x-coordinate and dose-to-clear (mJ/cm$^2$) is the y-coordinate. A swing curve is any one of the curves used to plot a parameter of the lithographic system against the photoresist thickness. The particular swing curve depicted plots dose-to-clear as a function of photoresist thickness, the amount of light needed to fully expose the particular thickness of the photoresist. Such swing curve may be derived by the user experimentally for a particular photoresist or may be prepared by the provider of the photoresist.

Exposing a photoresist involves the propagation of exposing light through a film of partially absorbing material (the photoresist) that has been deposited as a thin layer that is partially reflective. This propagation generates interference effects that result in a sinusoidal variation in the dose-to-clear, the dose need to fully expose the photoresist of the thickness plotted, that is described as a dose-to-clear swing curve. It is this swing curve that the present invention employs for helping choose an appropriate photoresist thickness and trench depth to maximize the light that gets into the trench to serve usefully in exposing the photoresist in the trench.

It is to be noted that the amplitude of each swing increases with photoresist thickness and the corresponding dose-to-clear level increases with an increase in photoresist thickness.

As mentioned earlier, various other characteristics are also important. It is generally desirable that the substrate provide high reflectivity since the higher the reflectivity of the substrate and the dielectric cap on which the photoresist is deposited, the larger is the amplitude of the swing. Another factor that is important is that the photoresist thicknesses require dose-to-clear light intensities that permit operation with a conveniently low intensity of the exposing light.

With these considerations in mind and a swing curve available for the particular resist to be used, one normally proceeds as follows.

First there is calculated the trench depth desired to be used. Typically the depth should be in the 0.4–0.8 micrometer range to permit achieving an appropriate conductance for the conductive fill to be used in the trench as the interconnection of the circuit elements. This generally amounts to a distance on the x-axis of the swing curve of FIG. 2 which is between about 4.5 to 7.5 oscillations (swings) of the swing curve. Moreover, in order to establish a 180° phase difference in the swing curve between the top and bottom of the trench, the optimum trench depth D needs to satisfy the following relationship for a trench being etched in an opaque material, such as polysilicon, or if a reflective opaque layer (e.g., of polysilicon) has been deposited over the body 10, as is mentioned earlier herein, $$D=[(2N+1)\lambda]/4n_r \qquad \text{Eq. 1,}$$

where N is an integer chosen to provide a thickness in the desired range, Ó is the wavelength of the exposing light, and $n_r$ is the refractive index of the photoresist.

If the trench is being etched into a transparent material, such as a silicon oxide glass, with a planar reflective surface underneath, the optimum trench depth D needs to satisfy the following:

$$D=[(2N+1)\lambda]/4n_p, \qquad \text{Eq. 2,}$$

where $n_p=n_r-n_s$, and $n_s$ is the refractive index of the transparent film.

In accordance with the present invention, a designer would have chosen a photoresist for use in the lithography and would have available its swing curve of the kind described.

Also as a design parameter there would be a range of trench depths that would be suitable, the range being of thicknesses sufficient to accommodate enough conductive fill to provide the desired low resistance of the interconnection network. There would first be used either equation 1 or 2 to find a suitable depth (D) of the trench. The choice of equation depending on whether the layer on which photoresist is supported is transparent or opaque. Once a value of D is determined, the designer would then find a peak on one swing of the swing curve of FIG. 2, for example, the peak shown by the reference number 30 of swing 32 for the photoresist thickness absent the trench, that is separated from a nadir (a minimum point) in another swing, such as nadir 34 on swing 36, by a thickness that matches the depth chosen for the trench. Typically this separation should amount to between 4.5 and 7.5 periods (swings) of the swing curve corresponding to a trench depth of between 0.2 and 0.5 micrometers. The intensity of the exposing light should be sufficient to clear the photoresist and is easy determined from the swing curve.

Often for the best match, it may be necessary to move slightly off the peak and nadir values and/or the calculated ideal trench depth. In some cases some improvement can be achieved by a slight widening of the trench in the region of the contact hole. In extreme mismatch cases one may need to change to photoresist with a more suitable swing curve or even change the wave length of the light used to a more suitable wavelength to find a better match.

With the trench 16 depth and photoresist thickness chosen as described, there should be maximized the amount of exposing light reaching the bottom of the trench 16, and minimized the amount of photoresist left in the trench 16 where a contact hole 18 is formed.

It is to be appreciated that specific embodiments of the invention described hereinbefore are merely illustrative of the general principles of the invention. Various modifcations may be made by those skilled in the are which are consistent with the principles set forth.

What is claimed is:

1. A process for providing an interconnection pattern in an insulating layer that extends over a surface of a semiconductor body that includes circuit elements to be interconnected, the process comprising the steps of:

forming a trench in the insulator layer that is to be filled with a conductor that is to provide conductive interconnection of circuit elements in the body;

providing a layer of photoresist on the insulating layer that fills the trench and forms a substantially planar surface over the insulation layer;

exposing the photoresist with light in a pattern designed for forming contact holes in the trench for providing vias through the insulating layer to circuit elements in the body;

developing the pattern for baring the area of the desired contact holes;

etching the contact holes in the trench; and filling the trench and the vias in the insulating layer with a conductor for providing the interconnection pattern; and wherein a thickness of the photoresist is chosen such that the photoresist has low sensitivity to light outside the trench and the thickness corresponds to a thickness where there is a maximum in the dose-to-clear swing curve of the photoresist, and the trench depth is chosen such that the photoresist has high sensitivity to light inside the trench and the photoresist thickness in the trench corresponds to a thickness where there is a minimum in said swing curve and in which the photoresist overlies an opaque substrate that is reflective, characterized in that the trench is formed to a depth D given by $[(2N+1)\lambda]/4n_r$, where N is an integer, $\lambda$ is the wavelength of the exposing light, and $n_r$ is th refractive index of the photoresist.

2. The process of claim 1 where the thickness of the photoresist in the absence of a trench corresponds to a peak in a swing of the dose-to-clear swing curve of the photoresist that is less than the photoresist thickness at a nadir in a different swing of the swing curve by the depth of the trench.

3. The process of claim 2 in which N is chosen to provide a depth of the trench that is between about 4.5 and 7.5 oscillations of the dose-to-clear swing curve.

4. The process of claim 3 in which the thickness of the photoresist is chosen to correspond to about five and one half oscillations of the dose-to-clear swing curve.

5. The process of claim 1 in which the photoresist overlies a transparent layer of the substrate, characterized in that the trench is formed to a depth D that is given by $[(2N+1)\lambda]/4n_p$, where N is an integer, $\lambda$ is the wavelength of the exposing light, and $n_p$ is the difference between the index of refraction of the photoresist and the index of refraction of the transparent portion of the insulating layer.

6. The process of claim 5 where the thickness of the photoresist in the absence of a trench corresponds to a peak in a swing of the dose-to-clear swing curve of the photoresist that is less than the photoresist thickness at a nadir in a different swing of the swing curve by the depth of the trench.

7. The process of claim 6 in which N is chosen to provide a depth of the trench that is between about 4.5 and 7.5 oscillations of the dose-to-clear swing curve.

8. The process of claim 7 in which the thickness of the photoresist is chosen to correspond to about five and one half oscillations of the dose-to-clear swing curve.

9. A process for providing an interconnection pattern in an insulating layer that is opaque and extends over a surface of a semiconductor body that includes circuit elements to be interconnected, the process comprising the steps of:

forming a trench in the insulating layer that is to be filled with a conductor that is to provide conductive interconnection of circuit elements in the body;

providing on top of the insulating layer a layer of a photoresist that fills the trench and forms a smooth surface over the insulating layer;

exposing the photoresist with light in a pattern designed for forming contact holes in the trench for providing vias through the insulating layer to circuit elements in the body;

developing the pattern for baring the area of the desired contact holes;

etching the contact holes in the trench; and filling the trench and the vias in the insulating layer with a conductor for providing the interconnection pattern; and wherein the trench is formed to a depth D given by $[(2N+1)\lambda]/4n_r$, where N is an integer, $\lambda$ is the wavelength of the exposing light, and $n_r$ is the refractive index of the photoresist, and the thickness of the photoresist in the absence of a trench corresponds to a peak in a swing of the dose-to-clear swing curve of the photoresist that is less than the photoresist thickness at a nadir in a different swing of the swing curve by the depth of the trench.

10. The process of claim 9 in which the semiconductor body is of silicon and the insulating layer is a dielectric cap of an oxide of silicon.

11. The process of claim 9 in which N is chosen to provide a depth of the trench that is between about 4.5 and 7.5 oscillations of the dose-to-clear swing curve.

12. The process of claim 9 in which the thickness of the photoresist is chosen to correspond to about five and one half oscillations of the dose-to-clear swing curve.

13. A process for providing an interconnection pattern in an insulating layer that includes a surface portion that is transparent and that extends over a surface of a semiconductor body that includes circuit elements to be interconnected, the process comprising the steps of:

forming a trench in the insulating layer that is to be filled with a conductor that is to provide conductive interconnection of circuit elements in the body;

providing on the insulating layer a layer of photoresist that fills the trench and forms a smooth surface over the insulating layer;

exposing the photoresist with light in a pattern designed for forming contact holes in the trench for providing vias through the insulating layer to circuit elements in the body;

developing the pattern for baring the area of the desired contact holes;

etching the contact holes in the trench; and filling the trench and the vias in the insulating layer with a conductor for providing the interconnection pattern; and wherein the trench is formed to a depth D that is given by $[(2N+1)\lambda]/4n_p$, where N is an integer, $\lambda$ is the wavelength of the exposing light, $n_p$ is the difference between the index of refraction of the photoresist and the index of refraction of the transparent portion of the insulating layer, and the thickness of the photoresist in the absence of a trench corresponds to a peak in a swing of the dose-to-clear swing curve of the photoresist that is less than the photoresist thickness at a nadir in a different swing of the swing curve by the depth of the trench.

14. A process for forming contact holes in a trench in an insulating layer that overlies a semiconductor body that includes components of an integrated circuit to which conductive contacts need to be provided, the insulating layer being transparent to the light involved, the process comprising the steps of:

depositing a layer of photoresist on the insulating layer;

irradiating the photoresist layer with light for forming a desired pattern of trenches in the photoresist;

etching a desired pattern of trenches in the photoresist and in the insulating layer;

depositing a layer of photoresist on the insulating layer;

irradiating the photoresist layer with light for forming a desired pattern of contact holes in the photoresist;

etching a desired pattern of contact holes in the photoresist and in the insulating layer;

wherein the trench is formed to a depth D that is given by $[(2N+1)\lambda]/4n_p$, where N is an integer, $\lambda$ is the wavelength of the exposing light, $n_p$ is the difference between the index of refraction of the photoresist and the index of refraction of the transparent portion of the insulating layer, and the thickness of the photoresist in the absence of a trench corresponds to a peak in a swing of the dose-to-clear swing curve of the photoresist that is less than the photoresist thickness at a nadir in a different swing of the swing curve by the depth of the trench.

15. A process for forming contact holes in a trench in an insulating layer that is opaque and overlies a semiconductor body that includes components of an integrated circuit to which conductive contacts need to be provided, the process comprising the steps of:

depositing a layer of photoresist on the insulating layer;

irradiating the photoresist layer with light for forming a desired pattern of trenches in the photoresist;

etching a desired pattern of trenches in the photoresist and in the insulating layer;

depositing a layer of photoresist on the insulating layer;

irradiating the photoresist layer with light for forming a desired pattern of contact holes in the photoresist;

etching a desired pattern of contact holes in the photoresist and in the insulating layer;

wherein the trench is formed to a depth D given by $[(2N+1)\lambda]/4n_r$, where N is an integer, $\lambda$ is the wavelength of the exposing light, and $n_r$ is the refractive index of the photoresist the thickness of the photoresist in the absence of a trench corresponds to a peak in a swing of the dose-to-clear swing curve of the photoresist that is less than the photoresist thickness at a nadir in a different swing of the swing curve by the depth of the trench.

* * * * *